United States Patent
Nakamura et al.

(10) Patent No.: US 11,380,825 B2
(45) Date of Patent: Jul. 5, 2022

(54) LIGHT EMITTING ELEMENT

(71) Applicant: Ushio Denki Kabushiki Kaisha, Tokyo (JP)

(72) Inventors: Kaoru Nakamura, Tokyo (JP); Ken Kataoka, Tokyo (JP); Hiroshige Hata, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/057,472

(22) PCT Filed: May 14, 2019

(86) PCT No.: PCT/JP2019/019120
§ 371 (c)(1),
(2) Date: Nov. 20, 2020

(87) PCT Pub. No.: WO2019/225405
PCT Pub. Date: Nov. 28, 2019

(65) Prior Publication Data
US 2021/0193884 A1 Jun. 24, 2021

(30) Foreign Application Priority Data
May 22, 2018 (JP) .............................. JP2018-097595

(51) Int. Cl.
*H01L 33/50* (2010.01)
*H01L 33/48* (2010.01)

(52) U.S. Cl.
CPC .......... *H01L 33/505* (2013.01); *H01L 33/486* (2013.01)

(58) Field of Classification Search
None
See application file for complete search history.

(56) References Cited

U.S. PATENT DOCUMENTS

| 5,779,058 A | 7/1998 | Satake et al. |
| 2006/0038198 A1 | 2/2006 | Chua et al. |

(Continued)

FOREIGN PATENT DOCUMENTS

| CN | 103022328 B | 6/2016 |
| JP | H08-29303 A | 2/1996 |

(Continued)

OTHER PUBLICATIONS

An Office Action; "Notice of Reasons for Refusal," mailed by the Japanese Patent Office dated Jan. 29, 2021, which corresponds to Japanese Patent Application No. 2018-97595 and is related to U.S. Appl. No. 17/057,472; with English language translation.

(Continued)

*Primary Examiner* — Bo B Jang
(74) *Attorney, Agent, or Firm* — Studebaker & Brackett PC (57) ABSTRACT

A light emitting element includes an LED element that emits an excitation light having a single peak wavelength within a range of greater than or equal to 380 nm and less than or equal to 500 nm; a fluorescent body to which at least a portion of the excitation light enters to emit fluorescence; and a light extraction surface that emits an output light formed by superimposing the excitation light and the fluorescence. The output light exhibits light emission over a range of at least greater than or equal to the peak wavelength of the excitation light and less than or equal to 1050 nm, and all of the output light have a light emission intensity of greater than or equal to a light emission intensity at 1050 nm within a range of at least the peak wavelength of the excitation light to 1050 nm.

5 Claims, 3 Drawing Sheets

(56) References Cited

U.S. PATENT DOCUMENTS

2006/0126326 A1  6/2006  Ng et al.
2016/0169460 A1  6/2016  Suto et al.
2018/0358514 A1  12/2018  Tragi et al.

FOREIGN PATENT DOCUMENTS

| JP | 3079932 B2 | 8/2000 |
| JP | 2006-060238 A | 3/2006 |
| JP | 2006-173622 A | 6/2006 |
| JP | 2006-332269 A | 12/2006 |
| JP | 2008-302314 A | 12/2008 |
| JP | 2016-115941 A | 6/2016 |
| WO | 2016/174236 A1 | 11/2016 |

OTHER PUBLICATIONS

The extended European search report issued by the European Patent Office dated Jun. 10, 2021, which corresponds to European Patent Application No. 19807184.7-1211 and is related to U.S. Appl. No. 17/057,472.

International Search Report issued in PCT/JP2019/019120; dated Aug. 6, 2019.

Yang Li, et al., Tailoring of the trap distribution and crystal field in $Cr^{3+}$-doped non-gallate phosphors with near-infrared long-persistence phosphorescence, NPG Asia Materials, Jul. 2015.

An Office Action; "Notice of Reasons for Refusal," issued by the Japanese Patent Office dated Dec. 11, 2019, which corresponds to Japanese Patent Application No. 2018-097595; with English language translation.

An Office Action; "Decision of Refusal," issued by the Japanese Patent Office dated Apr. 28, 2020, which corresponds to Japanese Patent Application No. 2018-097595; with English language translation.

Notification of Transmittal of Translation of the International Preliminary Report on Patentability and Translation of Written Opinion of the International Searching Authority; PCT/JP2019/019120 ; dated Dec. 3, 2020.

An Office Action issued by the Japanese Patent Office dated Oct. 26, 2021, which corresponds to Japanese Patent Application No. 2018-097595 and is related to U.S. Appl. No. 17/057,472 with English language translation.

LIGHT EMITTING ELEMENT

TECHNICAL FIELD

The present invention relates to light emitting elements, and more particularly to a light emitting element including an LED element for excitation and a fluorescent body.

BACKGROUND ART

A sorting machine for removing foreign substances contained in grains such as rice and beans has been conventionally known (see e.g., Patent Document 1). The conventional sorting machine irradiates the grain to be sorted with light having a predetermined wavelength, and detects the inclusion of foreign matter based on the difference in the amount of light received by the light receiving sensor.

In recent years, the sorting machine is required to be adapted to an object that cannot be sorted only by the image information received by the light receiving sensor. As an example, it is required to realize a sorting machine capable of sorting plastics composed of different components from a group of plastics to be sorted. In performing such sorting, the image information received by the light receiving sensor through the conventional method is not sufficient, and it is required to acquire detailed wavelength information included in the reflected light from the object.

In order to acquire such wavelength information, the development of a sorting machine combined with a hyperspectral camera has been progressing. Since the light absorption characteristics differ when the components constituting the object are different, the components can be analyzed by receiving the light reflected from the object with a hyperspectral camera and analyzing the wavelength. That is, according to such a sorting machine, as described above, plastics composed of different components can be sorted from a group of plastics to be sorted.

When receiving the reflected light from the object with the hyperspectral camera and performing wavelength analysis, it is desirable that the light irradiating the object have a wide band from the viewpoint of improving the analysis precision. Conventionally, fluorescent lamps, halogen lamps, and the like have been widely used as such light sources (see, e.g., Patent Document 2 below).

PRIOR ART DOCUMENT

Patent Document

Patent Document 1: JP-A-8-29303
Patent Document 2: Japanese Patent Publication No. 3079932

SUMMARY OF THE INVENTION

Problems to be Solved by the Invention

Halogen lamps have a short life, and maintenance such as lamp replacement is frequent. Therefore, the present inventors are considering adopting a light source using an LED element having excellent life characteristics instead of a halogen lamp. However, conventionally, there has been no LED element having a wideband wavelength component from the visible region to the infrared region.

Conventionally, a light emitting element that generates white light by using a GaN-based LED element that emits blue light and a fluorescent body has been used, for example, for lighting applications. Furthermore, conventionally, a GaAs-based LED element that emits infrared light is known. The GaAs-based LED element has been developed before a GaN-based LED element, and is now available at extremely low price compared to the GaN-based LED element. Therefore, in principle, it is possible to realize a wideband LED element by combining a white LED element including the GaN-based LED element and the fluorescent body and a GaAs-based infrared LED element.

Figure 3A:
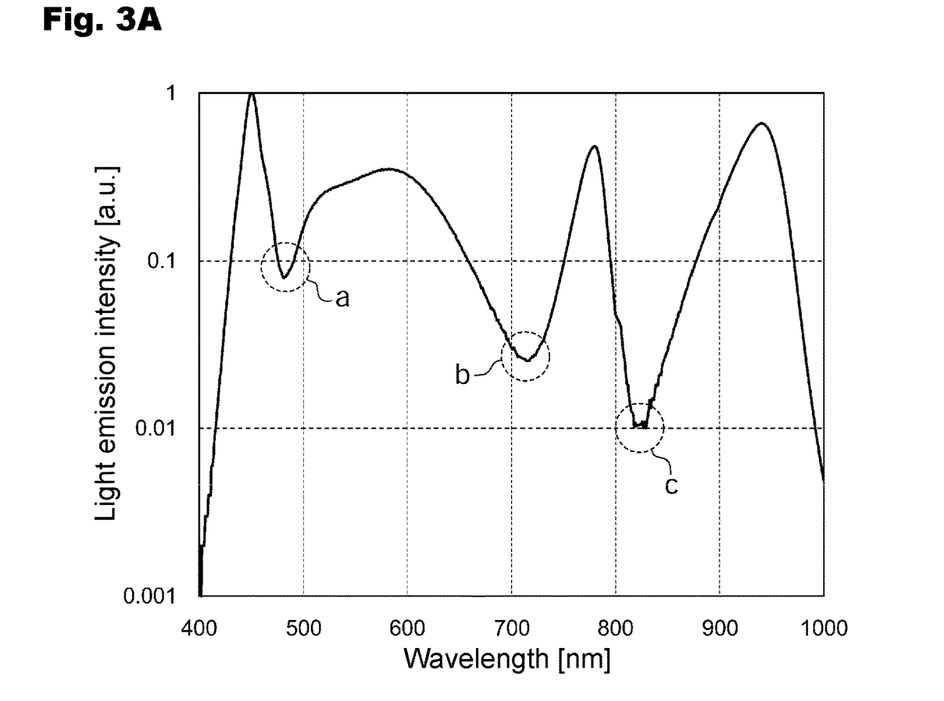
FIG. 3A is an example of a spectrum of light emitted from a light source formed by combining a plurality of LED elements exhibiting different peak wavelengths.

FIG. 3A shows an example of a spectrum of an output light when a white LED element composed of a GaN-based LED element having a peak wavelength of 450 nm and a fluorescent body made of YAG (yttrium aluminum garnet)-based material, a GaAs-based LED element having a peak wavelength of 780 nm, and a GaAs-based LED element having a wavelength of 940 nm are arrayed and are turned on at the same time. In FIG. 3A, the horizontal axis represents the wavelength [nm] and the vertical axis represents the relative value [a.u.] of the light emission intensity. The light emission intensity of each wavelength is defined as a relative value based on the light emission intensity at the peak wavelength of the GaN-based LED element serving as an excitation light source.

According to the spectrum shown in FIG. 3A, high light emission intensity is realized over a wide range from the visible region to the infrared region. Therefore, it is promising that it can be used for component analysis of an object by irradiating the object with such light, receiving the reflected light with a hyperspectral camera, and performing an intensity analysis for each wavelength.

However, as described above, the spectrum shown in FIG. 3A is realized by combining a plurality of types of LED elements exhibiting different peak wavelengths, more specifically, a GaN-based LED element and a GaAs-based LED element. That is, these LED elements are designed so that different peak wavelengths can be realized by differing compositions and structures (number of layers, film thickness, etc.).

Figure 3B:
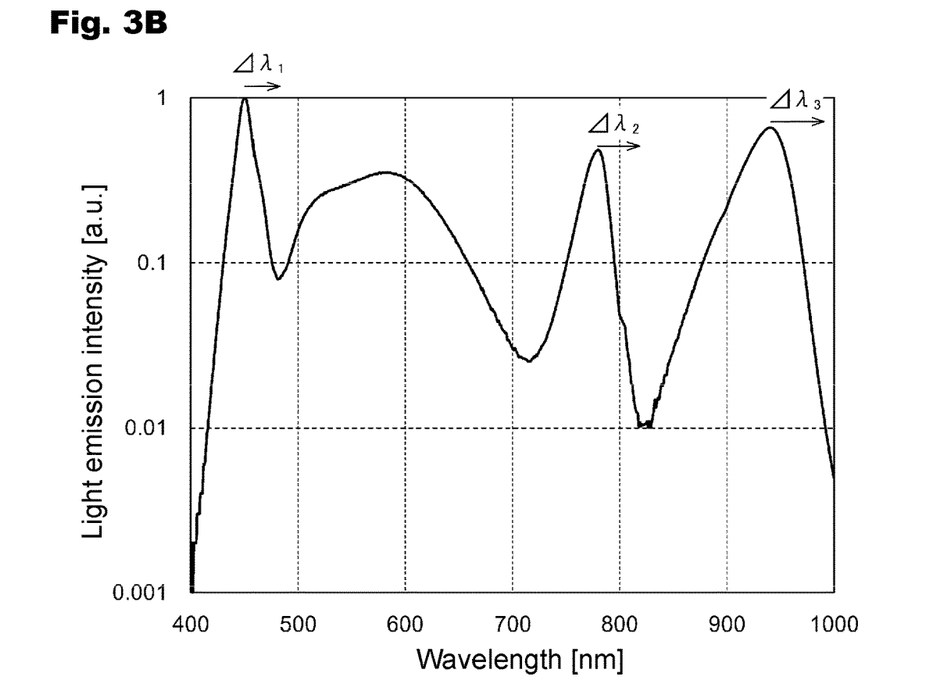
FIG. 3B is a view schematically showing change in peak value of the spectrum when an environmental temperature of the light emitting element exhibiting the spectrum of FIG. 3A increases.

When the light source is turned on, the temperature rises over time. It is known that the emission wavelength of an LED element shifts depending on the temperature environment. The amount of this wavelength shift differs depending on the composition and structure of the LED element. That is, as shown in FIG. 3B, the values of the shift amount $\Delta\lambda_1$, $\Delta\lambda_2$, and $\Delta\lambda_3$ of the peak wavelength are different from each other. Furthermore, when the light emitting state of the LED element continues, the element deteriorates and the light emission intensity decreases, where the degree of this decrease also depends on the composition and structure of the LED element.

That is, when a light source is realized by combining a plurality of LED elements exhibiting different peak wavelengths, the aspect of the spectrum of the output light from the light source changes as the light emission time elapses. When such a light source is used for a sorting machine application, even if the same object is irradiated with light, the wavelength distribution of the reflected light may change over time, and when the component analysis of the object is performed based on the light emission intensity by wavelength included in the reflected light, the precision of the analysis may decrease.

In view of the above problems, an object of the present invention is to provide a light emitting element that exhibits light emission of wideband and in which there is little tendency for a spectrum of light emission intensity to change with time.

Means for Solving the Problems

A light emitting element according to the present invention includes: an LED element that emits an excitation light having a single peak wavelength within a range of greater than or equal to 380 nm and less than or equal to 500 nm; a fluorescent body to which at least a portion of the excitation light enters to emit fluorescence having a wavelength longer than the excitation light; and a light extraction surface that emits an output light formed by superimposing the excitation light and the fluorescence; where the output light exhibits light emission over a range of at least greater than or equal to the peak wavelength of the excitation light and less than or equal to 1050 nm, and all of the output light have a light emission intensity of greater than or equal to a light emission intensity at 1050 nm within a range of at least the peak wavelength of the excitation light to 1050 nm.

The light emitting element does not include a plurality of types of LED elements having different peak wavelengths, but includes an LED element indicating a single peak wavelength. Then, a wideband light is generated by the excitation light emitted from the LED element and the fluorescence emitted from the fluorescent body excited by the excitation light.

Since the light emitting element according to the present invention does not include a plurality of types of LED elements having different physical properties and structures, an aspect of change in spectrum involved in temperature change over time or deterioration of the element is due to the properties of the LED element that emits the excitation light. Therefore, although the light emission intensity of the entire output light may decrease with time, the aspect of spectrum of the output light hardly changes. Furthermore, the light emitting element according to the present invention exhibits light emission in a wideband of at least greater than or equal to the peak wavelength of the excitation light and less than or equal to 1050 nm. Therefore, when the output light from the light emitting element is used as a light source of a sorting machine used for component analysis or the like, there is little possibility that the precision of the analysis will reduce over time.

In addition, in the present specification, "exhibiting light emission" means indicating an intensity of greater than or equal to 0.03% with respect to the light emission intensity at the peak wavelength of the excitation light.

The output light may exhibit light emission having a wavelength in a range of greater than or equal to 430 nm and less than or equal to 1050 nm. In a sorting machine using a hyperspectral camera, an object is identified using image information captured by light in a normal visible light region and detailed wavelength information. According to the light emitting element described above, an output light indicating a wavelength component of greater than or equal to 430 nm and less than or equal to 1050 nm can be obtained, and thus both the image information and the wavelength information can be obtained by irradiating the object with the output light.

In the output light, a minimum value of the light emission intensity within the range of greater than or equal to the peak wavelength of the excitation light and less than or equal to 1050 nm may be greater than or equal to 0.5% with respect to the light emission intensity at the peak wavelength of the excitation light.

For example, according to the example shown in FIG. 3A, a minimum value appears in the spectrum at areas illustrated with symbols a, b, and c. The minimum value indicated by the symbol "a" corresponds to the connecting area of the spectrum of the excitation light and the spectrum of the fluorescence generated by the fluorescent body for white LED. The minimum value indicated by the symbol "b" corresponds to the connecting area of the spectrum of the fluorescence and the spectrum of the LED device having a peak wavelength of 780 nm. The minimum value indicated by the symbol "c" corresponds to the connecting area of the spectrum of the LED element having a peak wavelength of 780 nm and the spectrum of the LED element having a peak wavelength of 940 nm.

In the light (excitation light) emitted from the LED element for excitation, a peak wavelength is assumed as the maximum intensity, and the light emission intensity decreases as the wavelength being away from the peak wavelength increases. For the fluorescence generated when the excitation light enters the fluorescent body as well, assuming the vicinity of a certain wavelength (peak wavelength of the fluorescence) determined by the properties of the fluorescent body is a maximum intensity, the light emission intensity decreases as the wavelength being away from the peak wavelength increases. That is, in the spectrum of light emitted from the light emitting element according to the present invention, there is a possibility a minimum value of light emission intensity may be confirmed near the boundary of the wavelength region derived from the excitation light and the wavelength region derived from the fluorescence. As in the configuration described above, with the light emitting element being realized so that the minimum value becomes greater than or equal to 0.5% with respect to the light emission intensity at the peak wavelength of the excitation light, the output light from the light emitting element indicates a sufficiently high light emission intensity over a wideband. As a result, high analysis precision is realized when the light emitting element is used as a light source for a sorting machine.

In the present specification, the "minimum value of light emission intensity" does not include a value derived from fluctuations in light emission intensity due to minute noise contained in the spectrum. Such minute noise is derived from a device that measures the spectrum of the output light, and for example, when the output light is received and the spectrum is measured with different devices, the aspect changes, and hence whether or not it is a noise component can be determined.

The fluorescent body may include a first fluorescent body that generates a first fluorescence having a peak wavelength in the range of greater than or equal to 500 nm and less than or equal to 600 nm, and a second fluorescent body that generates a second fluorescence having a peak wavelength in the range of greater than or equal to 600 nm and less than or equal to 1000 nm, when the excitation light enters thereto.

The second fluorescent body may include a fluorescent body that generates fluorescence having a peak wavelength in the range of greater than or equal to 600 nm and less than or equal to 900 nm, and a fluorescent body that generates fluorescence having a peak wavelength in the range of greater than or equal to 900 nm and less than or equal to 1050 nm. In this case, a light emitting element indicating high light emission intensity even when the wavelength is in the vicinity of 1000 nm is realized.

The fluorescent body may be formed by mixing or stacking at least the first fluorescent body and the second fluorescent body.

Effect of the Invention

According to the present invention, a light emitting element that exhibits light emission of wideband and in which there is little tendency for a spectrum of light emission intensity to change with time.

MODE FOR CARRYING OUT THE INVENTION

An embodiment of a light emitting element according to the present invention will be appropriately described with reference to the drawings. In the following drawings, the dimensional ratio on the drawing and the actual dimensional ratio do not always match.

Figure 1:
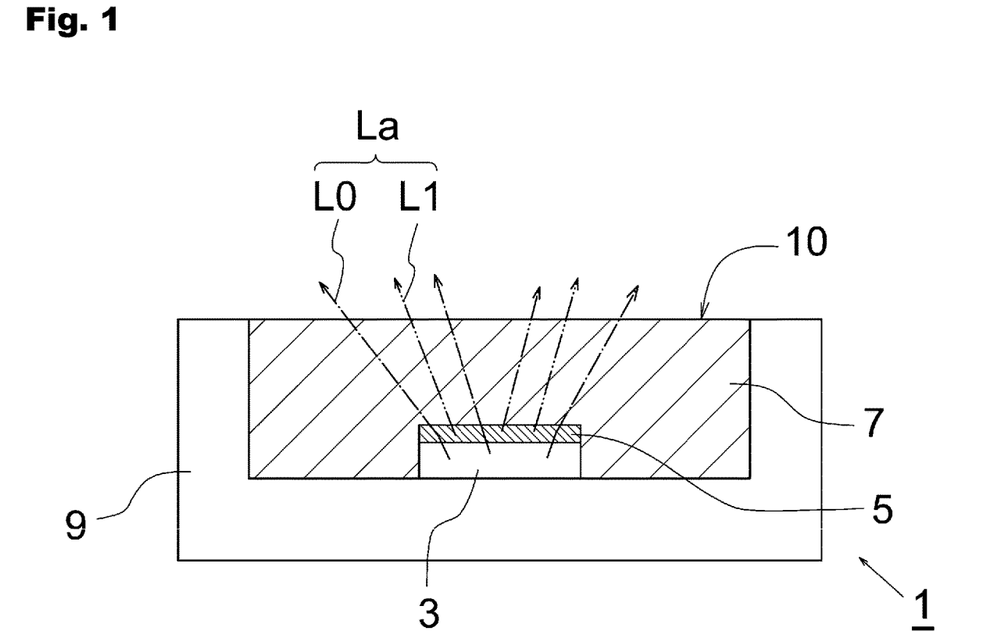
FIG. 1 is a view schematically showing a configuration of one embodiment of a light emitting element according to the present invention.

FIG. 1 is a view schematically showing a configuration of one embodiment of a light emitting element. The light emitting element 1 includes an LED element 3, a fluorescent body 5, a sealing layer 7, a package 9, and a light extraction surface 10.

The LED element 3 is an element that emits light L0 having a single peak wavelength in the range of greater than or equal to 380 nm and less than or equal to 500 nm. At least a portion of the light L0 enters the fluorescent body 5 and excites the fluorescent body 5, and is converted into a fluorescence L1 having a wavelength longer than that of the light L0. Hereinafter, the light L0 will be referred to as "excitation light L0".

As an example, the LED element 3 can be realized as an element including an active layer made of a nitride semiconductor such as GaN, InGaN, and AlInGaN. The peak wavelength of the excitation light L0 emitted from the LED element 3 is preferably greater than or equal to 400 nm and less than or equal to 500 nm, and more preferably greater than or equal to 430 nm and less than or equal to 480 nm.

In the present embodiment, the fluorescent body 5 is formed on the light extraction surface of the LED element 3. The fluorescent body 5 contains a material that is excited when receiving the excitation light L0 to generate fluorescence L1 that indicates a light emission intensity at greater than or equal to 500 nm and less than or equal to 1050 nm. More preferably, the fluorescent body 5 includes a first fluorescent body that generates a first fluorescence having a peak wavelength in the range of greater than or equal to 500 nm and less than or equal to 600 nm, and a second fluorescent body that generates a second fluorescence having a peak wavelength in the range of greater than or equal to 600 nm and less than or equal to 1050 nm, when the excitation light L0 enters.

As the first fluorescent body, for example, a material that receives blue light to generate green light or yellow light can be used, and more specifically, YAG ($Y_3Al_5O_{12}$: $Ce^{3+}$), β-sialon (SrSiAlON): $Eu^{2+}$), $Ca_3Sc_2Si_3O_{12}$: $Ce^{3+}$, $BaSi_2O_2N_2$: $Eu^{2+}$, $Li_2SrSiO_4$: $Eu^{2+}$, and the like can be used.

As the second fluorescent body, for example, a material that receives blue light to generate infrared light having a wavelength of greater than or equal to 800 nm can be used, and more specifically, $Zn_2SnO_4$: Cr', $Sc_2CaMoO_6$: $Yb^{3+}$, and the like can be used.

In the present embodiment, the fluorescent body 5 is generated as a mixture of the first fluorescent body and the second fluorescent body mixed with a binder made of an organic or inorganic material, and such a fluorescent body 5 is placed on the light extraction surface of the LED element 3. As the binder, silicone resin, epoxy resin, and the like can be used if it is an organic type, and $Al_2O_3$, $SiO_2$, and the like can be used if it is an inorganic type.

As another example, the fluorescent body 5 may be formed by stacking a layer formed by the first fluorescent body itself or by mixing the first fluorescent body and a predetermined binder, and a layer formed by the second fluorescent body itself or by mixing the second fluorescent body and a predetermined binder.

Furthermore, the fluorescent body 5 may include three or more types of fluorescent body materials in which peak wavelengths of the fluorescence generated by receiving the excitation light L0 are different.

In the present embodiment, the sealing layer 7 is formed so as to cover the upper surface and the side surface of the element in which the fluorescent body 5 is placed on the upper surface of the LED element 3. The sealing layer 7 is formed of a material having high transparency to the excitation light L0 and the fluorescence L1, prevents foreign substances and moisture from being mixed into the LED element 3 and the fluorescent body 5, and has a function of diffusing the excitation light L0 and the fluorescence L1. The sealing layer 7 can be made of, for example, a silicone resin or an epoxy resin.

The light emitting element 1 of the present embodiment includes a package 9 that forms a base for fixing the LED element 3. The package 9 is made of, for example, a resin material. More specifically, the package 9 is formed by using a thermoplastic resin such as a polyphthalamide resin, a liquid crystal polymer, or an unsaturated polyester, or a thermosetting resin such as an epoxy resin or a silicone resin. Furthermore, the package 9 may be formed of ceramics such as $Al_2O_3$ and AlN.

The package 9 is formed with a recessed region in advance so that an element including the LED element 3 and the fluorescent body 5 and the sealing layer 7 can be arranged. The LED element 3 and the fluorescent body 5 are placed in the recessed region, and the sealing layer 7 is further filled therearound.

Of the surfaces of the package 9, at least the surface on which the LED element 3 for excitation is placed may be provided with a reflecting member that reflects the excitation light L0. Furthermore, the package 9 itself may be made of a material having a high reflectance with respect to the excitation light L0.

When the LED element 3 is energized through the package 9, the excitation light L0 is emitted from the LED element 3. The excitation light L0 enters the fluorescent body 5, and a portion of the excitation light is transmitted through the fluorescent body 5 and the sealing layer 7 and emitted from the light extraction surface 10. Furthermore, the fluorescent body 5 is excited when the excitation light L0 enters to generate the fluorescence L1, which fluorescence L1 passes through the sealing layer 7 and is emitted from the light extraction surface 10. That is, the light emitting element 1 emits an output light La including the excitation light L0 and the fluorescence L1 from the light extraction surface 10.

It should be noted that a portion of the excitation light L0 emitted from the LED element 3 may be emitted from the light extraction surface 10 through the sealing layer 7 without entering the fluorescent body 5.

Next, an example of a method for manufacturing the light emitting element 1 will be described.

The LED element 3 made of a GaN-based material is prepared. An example of the outer shape of the LED element 3 is that the size of the light extraction surface is 1 mm square and the height is 150 μm. The LED element 3 is mounted on the surface of the package 9 in which the recessed region described above is formed, and is kept in an energizable state.

Next, for example, the first fluorescent body composed of YAG ($Y_3Al_5O_{12}$: Ce') and the second fluorescent body composed of $Zn_2SnO_4$: $Cr^{3+}$ are stirred so as to be sufficiently uniform in the silicone resin to generate a mixture. As an example, the total proportion of the first fluorescent body and the second fluorescent body in the mixture is 30 to 50 parts by mass.

Next, the silicone resin mixed with the fluorescent body described above is applied onto the light extraction surface of the LED element 3 by, for example, a dispenser. Here, the amount of silicone resin that is applied is an amount of an extent it stays on the light extraction surface of the LED element 3. As an example, the thickness of the applied silicone resin is 100 μm to 500 μm. The silicone resin applied here contains the first and second fluorescent bodies inside, and corresponds to the fluorescent body 5 in FIG. 1.

After applying the above silicone resin to the upper surface of the LED element 3, it is dried by heating. Thereafter, the recessed region of the package 9 is filled with the sealing layer 7 made of, for example, a silicone resin so as to cover the upper surface and the side surface of the LED element 3 and the fluorescent body 5. Then, again, it is dried by heating.

Figure 2A:
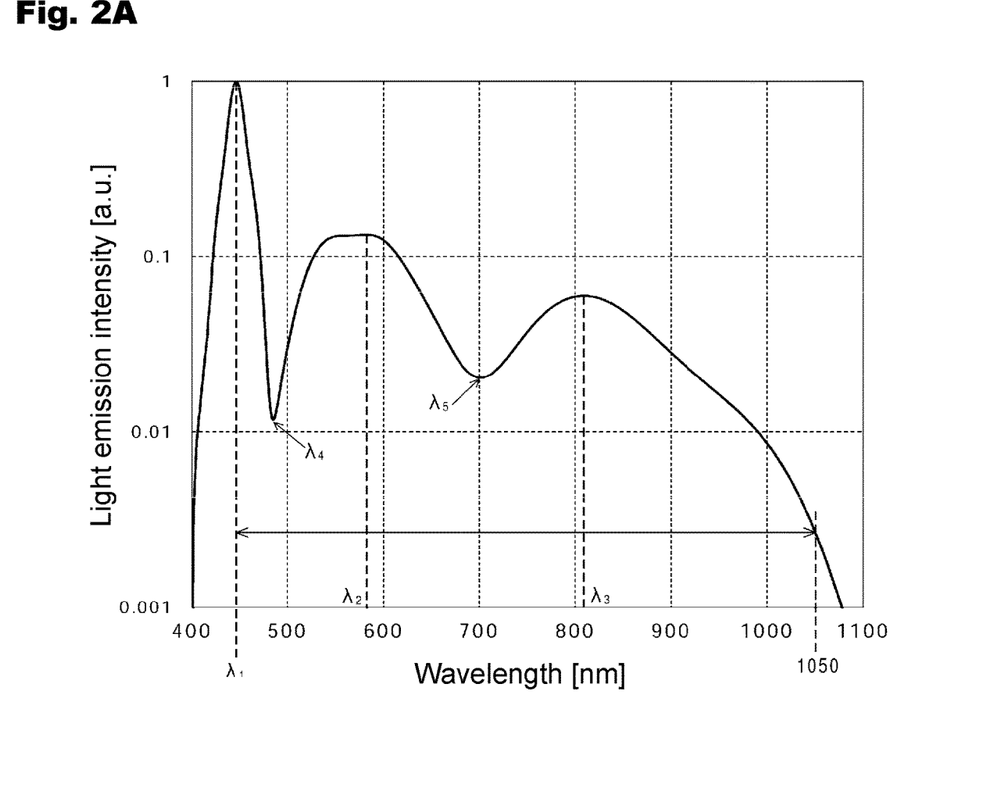
FIG. 2A is an example of a spectrum of light emitted from the light emitting element of the present invention.

FIG. 2A is an example of a spectrum of output light La emitted from the light extraction surface 10 of the light emitting element 1 manufactured by the above method. In FIG. 2A, the horizontal axis represents the wavelength [nm] and the vertical axis represents the relative value [a.u.] of the light emission intensity.

Here, as the LED element 3, a GaN-based element having a peak wavelength at 450 nm and a half width of 10 nm was used. According to FIG. 2A, even though one type of LED element 3 having a single peak wavelength $\lambda_1$ is used, it can be confirmed that the output light La emitted from a light emitting element 1 that exhibits light emission in a wide wavelength region of 400 nm to 1050 nm, and all of the output light La have a light emission intensity of greater than or equal to the light emission intensity at 1050 nm within a range from the peak wavelength $\lambda_1$ of the excitation light to 1050 nm is realized. The half width of the LED element 3 is, for example, greater than or equal to 5 nm and less than or equal to 20 nm.

In the result of FIG. 2A, the fluorescence L1 derived from the first fluorescent body having a peak wavelength of $\lambda_2$ (=582 nm) (hereinafter, may be referred to as "fluorescence L1a" for the sake of convenience) has a half width of 120 nm when the light emission intensity at the wavelength $\lambda_2$ is a maximum value. The half width of the fluorescence L1 (L1a) derived from the first fluorescent body is, for example, greater than or equal to 50 nm and less than or equal to 200 nm.

In the result of FIG. 2A, the fluorescence L1 derived from the second fluorescent body having a peak wavelength of $\lambda_3$ (=809 nm) (hereinafter, may be referred to as "fluorescence L1b" for the sake of convenience) has a half width of 120 nm when the light emission intensity at the wavelength $\lambda_3$ is a maximum value. The half width of the fluorescence L1 (L1b) derived from the second fluorescent body is, for example, greater than or equal to 50 nm and less than or equal to 200 nm.

According to the results of FIG. 2A, with respect to the wavelengths $\lambda_4$ and $\lambda_5$ indicating the minimum value of the light emission intensity in the range of greater than or equal to the peak wavelength $\lambda_1$ of the excitation light L0 and less than or equal to 1050 nm, the light emission intensity at the wavelength $\lambda_4$ is 1.2% with respect to the light emission intensity at the peak wavelength $\lambda_1$ of the excitation light L0, and the light emission intensity at the wavelength $\lambda_5$ is 2.0% with respect to the light emission intensity at the peak wavelength $\lambda_1$ of the excitation light.

The wavelength $\lambda_4$ indicating the minimum value corresponds to a connecting area of a portion of a tail on the longer wavelength side than the peak wavelength $\lambda_1$ of the excitation light L0 and a portion of a tail on the shorter wavelength side than the peak wavelength $\lambda_2$ of the fluorescence L1 (L1a) derived from the first fluorescent body. Furthermore, the wavelength $\lambda_5$ indicating the minimum value corresponds to a connecting area of a portion of a tail on the longer wavelength side than the peak wavelength $\lambda_2$ of the fluorescence L1 (L1a) derived from the first fluorescent body and a portion of a tail on the shorter wavelength side than the peak wavelength $\lambda_3$ of the fluorescence L1 (L1b) derived from the second fluorescent body.

That is, according to the result of FIG. 2A, a light emission intensity of greater than or equal to 0.5% with respect to the light emission intensity at the peak wavelength ki of the excitation light L0 is realized over a wide range of greater than or equal to the peak wavelength $\lambda_1$ of the excitation light L0 and less than or equal to 1050 nm.

Figure 2B:
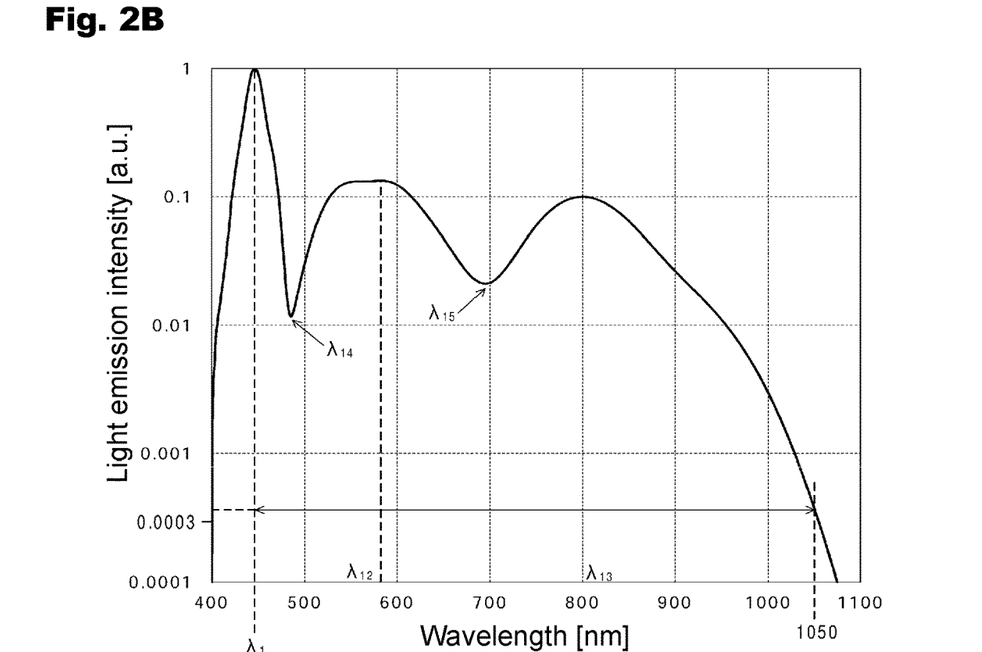
FIG. 2B is another example of a spectrum of light emitted from the light emitting element of the present invention.

FIG. 2B is an example of a spectrum of light La emitted from the light extraction surface 10 when the material of the fluorescent body 5 is different from that of the light emitting element 1 shown in FIG. 2A. In this example, as the fluorescent body 5, that which is produced by mixing a first fluorescent body composed of YAG ($Y_3Al_5O_{12}$: $Ce^{3+}$) and a second fluorescent body composed of $ScBO_3$: $Cr^{3+}$ with a silicone resin was adopted.

In the result of FIG. 2B as well, even though one type of LED element 3 having a single peak wavelength $\lambda_1$ is used, it can be confirmed that a light emitting element 1 that exhibits light emission in a wide wavelength region of 400 nm to 1050 nm, and all indicate a light emission intensity of greater than or equal to the light emission intensity at 1050 nm within a range from the peak wavelength $\lambda_1$ of the excitation light to 1050 nm is realized.

In the result of FIG. 2B, the fluorescence L1 derived from the first fluorescent body having a peak wavelength of $\lambda_{12}$ (=582 nm) (hereinafter, may be referred to as "fluorescence L1a" for the sake of convenience) has a half width of 120 nm when the light emission intensity at the wavelength $\lambda_{12}$ is a maximum value. The half width of the fluorescence L1 (L1a) derived from the first fluorescent body is, for example, greater than or equal to 50 nm and less than or equal to 200 nm.

In the result of FIG. 2B, the fluorescence L1 derived from the second fluorescent body having a peak wavelength of $\lambda_{13}$ (=800 nm) (hereinafter, may be referred to as "fluorescence L1b" for the sake of convenience) has a half width of 120 nm when the light emission intensity at the wavelength $\lambda_{13}$ is a maximum value. The half width of the fluorescence L1 (L1b) derived from the second fluorescent body is, for example, greater than or equal to 50 nm and less than or equal to 200 nm.

According to the results of FIG. 2B, with respect to the wavelengths $\lambda_{14}$ and $\lambda_{15}$ indicating the minimum value of the light emission intensity in the range of greater than or equal to the peak wavelength $\lambda_1$ of the excitation light L0 and less than or equal to 1050 nm, the light emission intensity at the wavelength $\lambda_{14}$ is 1.2% with respect to the light emission intensity at the peak wavelength $\lambda_1$ of the excitation light L0, and the light emission intensity at the wavelength $\lambda_{15}$ is 2.1% with respect to the light emission intensity at the peak wavelength $\lambda_1$ of the excitation light.

The wavelength λ14 indicating the minimum value corresponds to a connecting area of a portion of a tail on the longer wavelength side than the peak wavelength $\lambda_1$ of the excitation light L0 and a portion of a tail on the shorter wavelength side than the peak wavelength $\lambda_{12}$ of the fluorescence L1 (L1a) derived from the first fluorescent body. Furthermore, the wavelength $\lambda_{15}$ indicating the minimum value corresponds to a connecting area of a portion of a tail on the longer wavelength side than the peak wavelength $\lambda_{12}$ of the fluorescence L1 (L1a) derived from the first fluorescent body and a portion of a tail on the shorter wavelength side than the peak wavelength $\lambda_{13}$ of the fluorescence L1 (L1b) derived from the second fluorescent body.

That is, according to the result of FIG. 2B, a light emission intensity of greater than or equal to 0.5% with respect to the light emission intensity at the peak wavelength $\lambda_1$ of the excitation light L0 is realized over a wide range of greater than or equal to the peak wavelength $\lambda_1$ of the excitation light L0 and less than or equal to 1050 nm.

The wavelength λs indicating the minimum value in FIG. 2A and the wavelength $\lambda_{15}$ indicating the minimum value in FIG. 2B are both located in the range of greater than or equal to 600 nm and less than or equal to 800 nm. This is the result of forming the first fluorescent body with a material capable of generating fluorescence L1 (L1a) having a peak wavelength ($\lambda_2$, $\lambda_{12}$) in the range of greater than or equal to 500 nm and less than or equal to 600 nm, and forming the second fluorescent body with a material capable of generating fluorescence L1 (L1b) having a peak wavelength ($\lambda_3$, $\lambda_{13}$) in the range of greater than or equal to 600 nm and less than or equal to 1050 nm.

Figure 2C:
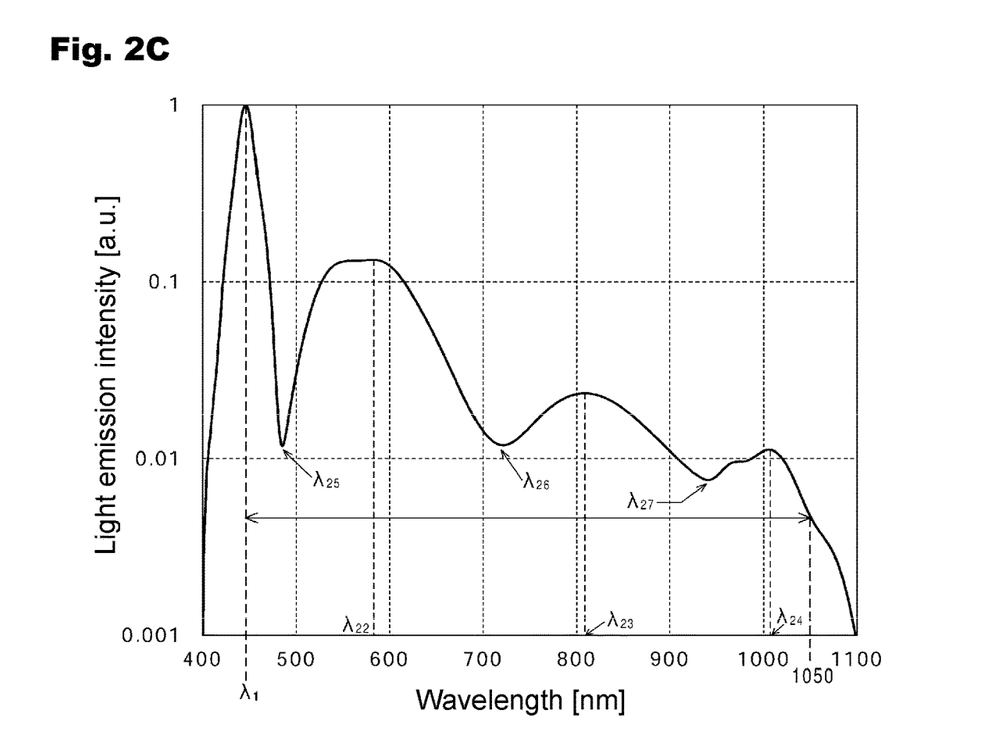
FIG. 2C is another example of a spectrum of light emitted from the light emitting element of the present invention.

FIG. 2C is an example of a spectrum of light La emitted from the light extraction surface 10 when the material of the fluorescent body 5 is different from that of the light emitting element 1 shown in FIG. 2A. In this example, as the fluorescent body 5, that which is produced by mixing the first fluorescent body composed of YAG ($Y_3Al_5O_{12}$: $Ce^{3+}$) and the second fluorescent body composed of $Zn_2SnO_4$: $Cr^{3+}$ and $Sc_2CaMoO_6$: $Yb^{3+}$ with a silicone resin was adopted. That is, in this example, three types of fluorescent bodies are included as the fluorescent body 5.

In the result of FIG. 2C as well, even though one type of LED element 3 having a single peak wavelength $\lambda_1$ is used, it can be confirmed that a light emitting element 1 that exhibits light emission in a wide wavelength region of 400 nm to 1050 nm, and all indicate a light emission intensity of greater than or equal to the light emission intensity at 1050 nm within a range from the peak wavelength $\lambda_1$ of the excitation light to 1050 nm is realized.

In the result of FIG. 2C, the fluorescence L1 derived from the first fluorescent body having a peak wavelength of $\lambda_{22}$ (=582 nm) (hereinafter, may be referred to as "fluorescence L1a" for the sake of convenience) has a half width of 120 nm when the light emission intensity at the wavelength $\lambda_{22}$ is a maximum value. The half width of the fluorescence L1 (L1a) derived from the first fluorescent body is, for example, greater than or equal to 50 nm and less than or equal to 200 nm.

In the result of FIG. 2C, the fluorescence L1 derived from the second fluorescent body having a peak wavelength of $\lambda_{23}$ (=809 nm) (hereinafter, may be referred to as "fluorescence L1b" for the sake of convenience) has a half width of 120 nm when the light emission intensity at the wavelength $\lambda_{23}$ is a maximum value. The half-value width of the fluorescence L1 (L1b) derived from the second fluorescent body having a peak wavelength of $\lambda_{23}$ is, for example, greater than or equal to 50 nm and less than or equal to 200 nm.

In the result of FIG. 2C, the fluorescence L1 derived from the second fluorescent body having a peak wavelength of $\lambda_{24}$ (=1010 nm) (hereinafter, may be referred to as "fluorescence L1c" for the sake of convenience) has a half width of 80 nm when the light emission intensity at the wavelength $\lambda_{24}$ is a maximum value. The half width of the fluorescence L1 (L1c) derived from the second fluorescent body having a peak wavelength of $\lambda_{24}$ is, for example, greater than or equal to 50 nm and less than or equal to 200 nm.

According to the results of FIG. 2C, with respect to the wavelengths $\lambda_{25}$, $\lambda_{26}$ and $\lambda_{27}$ indicating the minimum value of the light emission intensity in the range of greater than or equal to the peak wavelength $\lambda_1$ of the excitation light L0 and less than or equal to 1050 nm, the light emission intensity at the wavelength $\lambda_{25}$ is 1.2% with respect to the light emission intensity at the peak wavelength $\lambda_1$ of the excitation light L0, the light emission intensity at the wavelength $\lambda_{26}$ is 1.2% with respect to the light emission intensity at the peak wavelength $\lambda_1$ of the excitation light, and the light emission intensity at the wavelength $\lambda_{27}$ is 0.76% with respect to the light emission intensity at the peak wavelength $\lambda_1$ of the excitation light.

The wavelength $\lambda_{25}$ indicating the minimum value corresponds to a connecting area of a portion of a tail on the longer wavelength side than the peak wavelength $\lambda_1$ of the excitation light L0 and a portion of a tail on the shorter wavelength side than the peak wavelength λ22 of the fluorescence L1 (L1a) derived from the first fluorescent body. Furthermore, the wavelength $\lambda_{26}$ indicating the minimum value corresponds to a connecting area of a portion of a tail on the longer wavelength side than the peak wavelength $\lambda_{22}$ of the fluorescence L1 (L1a) derived from the first fluorescent body and a portion of a tail on the shorter wavelength side than the peak wavelength $\lambda_{23}$ of the fluorescence L1 (L1b) derived from the second fluorescent body. Moreover, the wavelength $\lambda_{27}$ indicating the minimum value corresponds to a connecting area of a portion of a tail on the longer wavelength side than the peak wavelength $\lambda_{23}$ of the fluorescence L1 (L1b) derived from the second fluorescent body and a portion of a tail on the shorter wavelength side than the peak wavelength $\lambda_{24}$ of the fluorescence L1 (L1c) derived from the second fluorescent body.

That is, according to the result of FIG. 2C, a light emission intensity of greater than or equal to 0.5% with respect to the light emission intensity at the peak wavelength $\lambda_1$ of the excitation light L0 is realized over a wide range of greater than or equal to the peak wavelength $\lambda_1$ of the excitation light L0 and less than or equal to 1050 nm.

The wavelength $\lambda_{26}$ indicating the minimum value in FIG. 2C is located in the range of greater than or equal to 600 nm and less than or equal to 900 nm, and the wavelength $\lambda_{27}$ indicating the minimum value is located in the range of greater than or equal to 900 nm and less than or equal to 1050 nm. This is the result of forming the first fluorescent body with a material capable of generating fluorescence L1 (L1a) having a peak wavelength $\lambda_{22}$ in the range of greater than or equal to 500 nm and less than or equal to 600 nm, and forming the second fluorescent body with a material capable of generating fluorescence L1 (L1b) having a peak wavelength $\lambda_{23}$ in the range of greater than or equal to 600 nm and less than or equal to 900 nm and a material capable of generating fluorescence L1 (L1c) having a peak wavelength $\lambda_{24}$ in the range of greater than or equal to 900 nm and less than or equal to 1050 nm.

Another Embodiment

Hereinafter, another embodiment will be described.

<1> FIG. 1 is a view merely showing an example of the light emitting element 1, and the present invention is not limited to the structure of FIG. 1. For example, the fluorescent body 5 may be formed in a dome shape so as to cover the upper surface and the side surface of the LED element 3. At this time, the sealing layer 7 does not necessarily need to be provided. In this case, the surface of the fluorescent body 5 formed in a dome shape constitutes the light extraction surface 10.

Furthermore, the fluorescent body 5 merely needs to contain two or more types of fluorescent bodies, and may not necessarily be mixed through a resin. Fluorescent plates obtained by simply sintering each fluorescent body in a plate-shape may be simply stacked, or a mixture of a plurality of types of fluorescent body particles may be sintered to a plate-shape for use.

<2> In the embodiments described above, a case where the fluorescent body 5 contains two or three types of fluorescent bodies has been described as an example, but the fluorescent body may contain four or more types of fluorescent bodies. Furthermore, the light emitting element 1 according to the present invention merely needs to include an LED element 3 that emits the excitation light L0 having a single peak wavelength, and a case where a plurality of LED elements 3 of the same type are provided is not to be excluded from the present invention.

DESCRIPTION OF REFERENCE SIGNS 1 light emitting element
5 LED element
7 fluorescent material
7 sealing layer
9 package
10 light extraction surface
L0 excitation light
L1 fluorescence
La output light

The invention claimed is:

1. A light emitting element comprising:
a light emitting diode (LED) element that emits an excitation light having a single peak wavelength within a range of greater than or equal to 380 nm and less than or equal to 500 nm;
a fluorescent body to which at least a portion of the excitation light enters to emit fluorescence having a wavelength longer than the excitation light; and
a light extraction surface that emits an output light formed by superimposing the excitation light and the fluorescence; wherein
the light emitting element does not include another LED element emitting light that has a different peak wavelength from the excitation light emitted by the LED element and that is directed toward the fluorescent body, and
the output light exhibits light emission over a range of at least greater than or equal to the peak wavelength of the excitation light and less than or equal to 1050 nm, and all of the output light have a light emission intensity of greater than or equal to a light emission intensity at 1050 nm within the range of at least greater than or equal to the peak wavelength of the excitation light and less than or equal to 1050 nm,
wherein in the output light, a minimum value of the light emission intensity within the range of at least greater than or equal to the peak wavelength of the excitation light and less than or equal to 1050 nm is greater than or equal to 0.5% with respect to the light emission intensity at the peak wavelength of the excitation light.

2. The light emitting element according to claim 1, wherein the fluorescent body includes a first fluorescent body that generates a first fluorescence having a peak wavelength in the range of greater than or equal to 500 nm and less than or equal to 600 nm, and a second fluorescent body that generates a second fluorescence having a peak wavelength in the range of greater than or equal to 600 nm and less than or equal to 1050 nm, when the excitation light enters.

3. The light emitting element according to claim 2, wherein the second fluorescent body includes a fluorescent body that generates a fluorescence having a peak wavelength in the range of greater than or equal to 600 nm and less than or equal to 900 nm, and a fluorescent body that generates a fluorescence having a peak wavelength in the range of greater than or equal to 900 nm and less than or equal to 1050 nm.

4. The light emitting element according to claim 3, wherein the fluorescent body is formed by mixing or stacking at least the first fluorescent body and the second fluorescent body.

5. The light emitting element according to claim 2, wherein the fluorescent body is formed by mixing or stacking at least the first fluorescent body and the second fluorescent body.

* * * * *